(12) United States Patent
Steger

(10) Patent No.: US 7,993,460 B2
(45) Date of Patent: Aug. 9, 2011

(54) SUBSTRATE SUPPORT HAVING DYNAMIC TEMPERATURE CONTROL

(75) Inventor: Robert J. Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 2011 days.

(21) Appl. No.: 10/608,091

(22) Filed: Jun. 30, 2003

(65) Prior Publication Data

US 2004/0261721 A1 Dec. 30, 2004

(51) Int. Cl.
*C23C 16/00* (2006.01)
*C23F 1/00* (2006.01)
*H01L 21/306* (2006.01)

(52) U.S. Cl. .................... 118/728; 156/345.51
(58) Field of Classification Search ............... 118/728; 156/345.51
See application file for complete search history.

(56) References Cited

U.S. PATENT DOCUMENTS

| | | | |
|---|---|---|---|
| 4,565,601 A | 1/1986 | Kakehi et al. | |
| 5,192,849 A | 3/1993 | Moslehi | |
| 5,221,403 A | 6/1993 | Nozawa et al. | |
| 5,225,663 A * | 7/1993 | Matsumura et al. | 219/543 |
| 5,310,453 A | 5/1994 | Fukasawa et al. | |
| 5,382,311 A | 1/1995 | Ishikawa et al. | |
| 5,609,720 A | 3/1997 | Lenz et al. | |
| 5,671,116 A | 9/1997 | Husain | |
| 5,675,471 A | 10/1997 | Kotecki | |
| 5,792,304 A | 8/1998 | Tamura et al. | |
| 5,835,334 A | 11/1998 | McMillin et al. | |
| 5,849,076 A * | 12/1998 | Gaylord et al. | 117/85 |
| 5,888,907 A | 3/1999 | Tomoyasu et al. | |
| 6,007,635 A * | 12/1999 | Mahawili | 118/728 |
| 6,077,357 A | 6/2000 | Rossman et al. | |
| 6,083,344 A | 7/2000 | Hanawa et al. | |
| 6,106,737 A | 8/2000 | Tomoyasu et al. | |
| 6,108,189 A | 8/2000 | Weldon et al. | |
| 6,179,921 B1 | 1/2001 | Ruffell et al. | |
| 6,182,602 B1 | 2/2001 | Redeker et al. | |
| 6,184,504 B1 * | 2/2001 | Cardella | 219/513 |
| 6,189,483 B1 | 2/2001 | Ishikawa et al. | |
| 6,231,776 B1 | 5/2001 | Flamm | |
| 6,310,755 B1 | 10/2001 | Kholodenko et al. | |
| 6,373,681 B2 | 4/2002 | Kanno et al. | |

(Continued)

FOREIGN PATENT DOCUMENTS

JP 03190125 A 8/1991

(Continued)

OTHER PUBLICATIONS

Fundamentals of Physics, Halliday; Sixth Edition 2003.*

(Continued)

*Primary Examiner* — Parviz Hassanzadeh
*Assistant Examiner* — Rakesh Dhingra
(74) *Attorney, Agent, or Firm* — Buchanan Ingersoll & Rooney PC

(57) ABSTRACT

A substrate support useful for a plasma processing apparatus includes a metallic heat transfer member and an overlying electrostatic chuck having a substrate support surface. The heat transfer member includes one or more passage through which a liquid is circulated to heat and/or cool the heat transfer member. The heat transfer member has a low thermal mass and can be rapidly heated and/or cooled to a desired temperature by the liquid, so as to rapidly change the substrate temperature during plasma processing.

14 Claims, 4 Drawing Sheets

U.S. PATENT DOCUMENTS

| | | |
|---|---|---|
| 6,377,437 B1 | 4/2002 | Sexton et al. |
| 6,378,600 B1 | 4/2002 | Moslehi |
| 6,394,797 B1 | 5/2002 | Sugaya et al. |
| 6,451,157 B1 | 9/2002 | Hubacek |
| 6,474,986 B2 * | 11/2002 | Oda et al. .................. 432/247 |
| 6,488,863 B2 * | 12/2002 | Yatsuda et al. ................ 216/72 |
| 6,529,686 B2 * | 3/2003 | Ramanan et al. ............ 392/418 |
| 6,635,580 B1 * | 10/2003 | Yang et al. .................. 438/715 |
| 6,676,805 B2 * | 1/2004 | Tamura et al. .......... 156/345.53 |
| 6,800,173 B2 * | 10/2004 | Chiang et al. ........... 156/345.33 |
| 7,022,616 B2 * | 4/2006 | Mimura et al. .............. 438/714 |
| 2001/0009178 A1 * | 7/2001 | Tamura et al. ............... 156/345 |
| 2001/0018828 A1 | 9/2001 | Kadotani |
| 2002/0047004 A1 * | 4/2002 | Johnsgard et al. ........... 219/390 |
| 2002/0075624 A1 * | 6/2002 | Wang et al. .................. 361/234 |
| 2004/0163601 A1 * | 8/2004 | Kadotani et al. ............. 118/728 |

FOREIGN PATENT DOCUMENTS

| | | |
|---|---|---|
| WO | 02/17384 A1 | 2/2002 |

OTHER PUBLICATIONS

International Search Report and Written Opinion dated Jan. 25, 2006 for PCT/US04/20749.

International Preliminary Report on Patentability dated Mar. 2, 2006 for PCT/US2004/020749.

Written Opinion dated Feb. 28, 2007 for Singapore Application No. 200508388.6.

* cited by examiner

US 7,993,460 B2

SUBSTRATE SUPPORT HAVING DYNAMIC TEMPERATURE CONTROL

BACKGROUND

Plasma processing apparatuses are used, e.g., for plasma etching of semiconducting, dielectric and metallic materials, plasma enhanced chemical vapor deposition ("PECVD"), and resist removal.

One type of plasma processing apparatus that is used in semiconductor material processing includes a reaction chamber. A substrate to be processed is supported in the reaction chamber on a substrate support. The substrate is typically secured on the substrate support by a substrate holder. A process gas is introduced into the reaction chamber by a gas distribution system. An electric field is established to generate a plasma from the process gas to process the substrate.

SUMMARY

A substrate support is provided. The substrate support can provide dynamic temperature control at a support surface on which a substrate is supported during processing of the substrate. The substrate support is useful in a plasma etch reactor of a plasma processing apparatus, for example.

A preferred embodiment of the substrate support comprises a ceramic member, a metallic heat transfer member overlying the ceramic member, and an electrostatic chuck overlying the heat transfer member. The heat transfer member has a low thermal mass. The heat transfer member includes at least one flow passage through which liquid can be circulated to heat and/or cool the heat transfer member. The electrostatic chuck has a support surface on which a substrate can be electrostatically clamped.

The substrate support preferably comprises a source of temperature controlled liquid in flow communication with the flow passage(s). The substrate support preferably also comprises a heat transfer gas source operable to supply a heat transfer gas between the support surface and the substrate. An optional controller can control operation of the liquid source and the heat transfer gas source, so as to control parameters of the liquid and heat transfer gas supplied to the substrate support.

The heat transfer member preferably can be rapidly heated and/or cooled by the liquid supplied to the flow passage(s). Accordingly, the substrate support can provide dynamic thermal control of a substrate on the substrate support.

A preferred embodiment of a method of processing a substrate in a plasma processing apparatus comprises supporting a substrate on a support surface of an electrostatic chuck in a reaction chamber of a plasma processing apparatus, and circulating a liquid through at least one flow passage in a metallic heat transfer member underlying the electrostatic chuck to control the temperature of the substrate. The heat transfer member has a low thermal mass.

DRAWINGS

DETAILED DESCRIPTION

Figure 1:
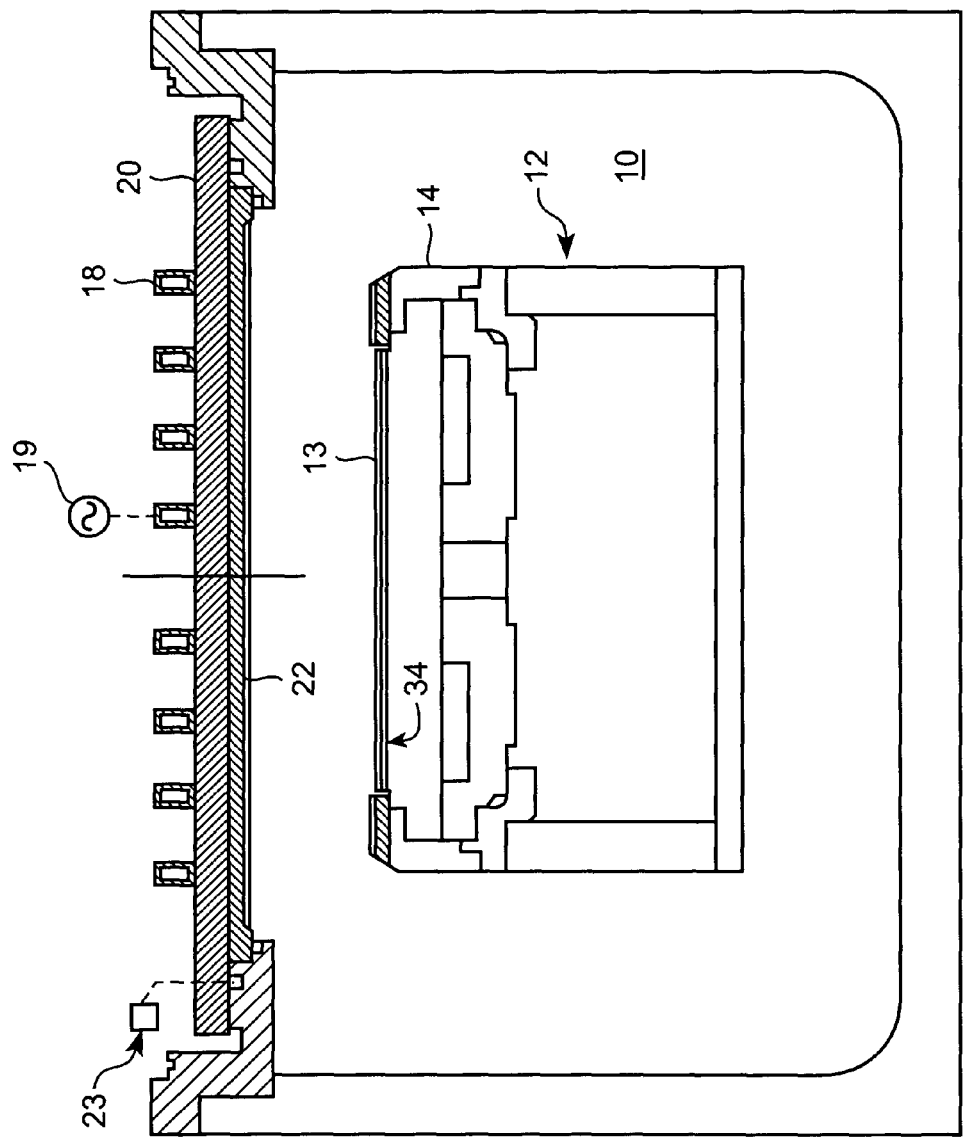
FIG. 1 depicts an exemplary plasma reactor in which embodiments of the substrate support can be used.

During plasma processing of a substrate (e.g., a semiconductor wafer, a flat panel display substrate, a dielectric material, or the like), it is desirable that material be removed from the substrate by etching, or that material be deposited on the substrate, as uniformly as possible so that a device fabricated from the processed substrate has satisfactory electrical properties. However, as substrate size increases, while the size of features formed on the substrate decreases, this goal is increasingly more difficult to achieve.

In order to enhance the uniformity of plasma processing of a substrate in a plasma processing apparatus, it is desirable to control the temperature at exposed surfaces of the substrate at which etching occurs, on which material is deposited (e.g., by a PECVD technique), and/or at which photoresist is removed. In plasma etching processes, variations in the substrate temperature, and/or in the rates of chemical reaction at the substrate's exposed surface, can cause variations in the etch rate of the substrate, as well as variations in etch selectivity and anisotropy. For example, if a wafer's temperature rises above a certain temperature, wafer damage (e.g., photoresist damage) can occur, and temperature-dependent chemical reactions can be altered. In material deposition processes, the deposition rate, as well as the composition and properties of materials that are deposited on substrates, can be varied significantly by changes in the temperature of the substrate during deposition.

In order to enhance heat transfer between the substrate support and a substrate supported on the substrate support, the substrate support can include a backside gas cooling system. However, the heat transfer capabilities of heat transfer gases are dependent on the surface conditions of the substrate support. As the surface conditions can change during processing, the ability of the heat transfer gas to remove heat from the substrate also can change.

A substrate support can include a liquid cooling system to remove heat during processing. In such a system, liquid is flowed through one or more flow passages in a metallic body ("cold plate") of the substrate support to either heat or cool the metallic body, thereby changing the temperature of the substrate on the substrate support. The rate at which a body can be heated or cooled is related to the body's heat capacity, or "thermal mass", C. The thermal mass of a body equals the product of the specific heat capacity, c, of the material of the body, and the mass, m, of the body (i.e., $C=c \cdot m$). Accordingly, the thermal mass of a body can be varied by changing its mass, which can be achieved by changing the body's volume. Also, the amount of heat, q, that needs to be added to a body by heating the body, or given off by the body by cooling the body, in order to change the body's temperature by an amount $\Delta T$, is given by: $q=c \cdot m \cdot \Delta T$. Thus, as the thermal mass of a body is increased, the amount of heat that must be added to or removed from the body in order to change its temperature by an amount $\Delta T$ also is increased.

A substrate support that includes a cold plate with a large thermal mass (e.g., a metallic cold plate having a thickness of 1¼ inch or greater), and also a liquid supply having a large liquid capacity, may be able to supply liquid to flow passages in the cold plate to maintain the substrate support at a fixed temperature during plasma processing. However, it has been determined that such a substrate support does not provide dynamic temperature control capabilities because a large amount of heat must be quickly added to or removed from the substrate support by the liquid to quickly change the substrate support's temperature. Consequently, a substrate support with such large thermal mass does not provide sufficiently responsive temperature control of a substrate supported on the substrate support.

It has been determined that a substrate support having dynamic temperature control capabilities can be provided by using a heat transfer member having a small thermal mass, which allows the heat transfer member to be rapidly heated and/or cooled to a desired temperature.

In a preferred embodiment, the substrate support comprises a liquid source operable to supply a liquid to heat and/or cool the heat transfer member to a desired temperature. The heat transfer member includes at least one flow passage through which the liquid is circulated from the liquid source to enhance the rate of heat transfer to or from the heat transfer member. The liquid source preferably can heat and/or cool a small volume of liquid. The temperature-controlled liquid can be supplied to the heat transfer member to provide fast response capabilities. Dynamic temperature control of the surface of the substrate support can be enhanced by the combination of the heat transfer member having a low thermal mass and the liquid source having rapid response capabilities. The liquid source preferably can also control selected parameters of the liquid, such as its temperature and/or flow rate.

In a preferred embodiment, the substrate support includes a heat transfer gas source, which is operable to supply a heat transfer gas between an upper surface of the substrate support and the substrate.

An exemplary plasma reactor in which preferred embodiments of the substrate support can be used is depicted in FIG. 1. The plasma reactor is an inductively coupled plasma reactor. The substrate support can also be used in other types of plasma reactors in which temperature control of a substrate during plasma processing is desired. For example, the substrate support can be used in other inductively coupled plasma reactor constructions, electrocyclotron resonance ("ECR"), magnetron, and capacitively coupled plasma reactors.

The plasma reactor shown in FIG. 1 comprises a reaction chamber 10 including a substrate support 12 with an electrostatic chuck 34, which electrostatically clamps a substrate 13, as well as applies an RF bias to the substrate. The substrate 13 can be a semiconductor wafer, for example. A focus ring 14 enhances plasma above the substrate 13. An energy source is disposed at the top of reaction chamber 10 to energize a process gas to generate plasma in the reaction chamber. The energy source can be an antenna 18 powered by an RF source 19, for example. The reaction chamber 10 includes vacuum pumping apparatus for maintaining the interior of the chamber at a desired pressure.

A dielectric window 20 is disposed between the antenna 18 and the interior of the processing chamber 10. A gas distribution plate 22 is beneath the window 20 and includes openings through which process gas is delivered from a gas supply 23 to the reaction chamber 10.

In operation, the substrate 13 is placed on the exposed upper surface of the substrate holder 12 and electrostatically clamped by the electrostatic chuck 34. A heat transfer gas preferably is introduced between the upper surface of the substrate holder 12 and the substrate 13 to enhance heat transfer between the substrate 13 and the upper surface. A process gas is supplied to the reaction chamber 10. A plasma is generated in the reaction chamber 10 by supplying RF power to the antenna 18.

Figure 2:
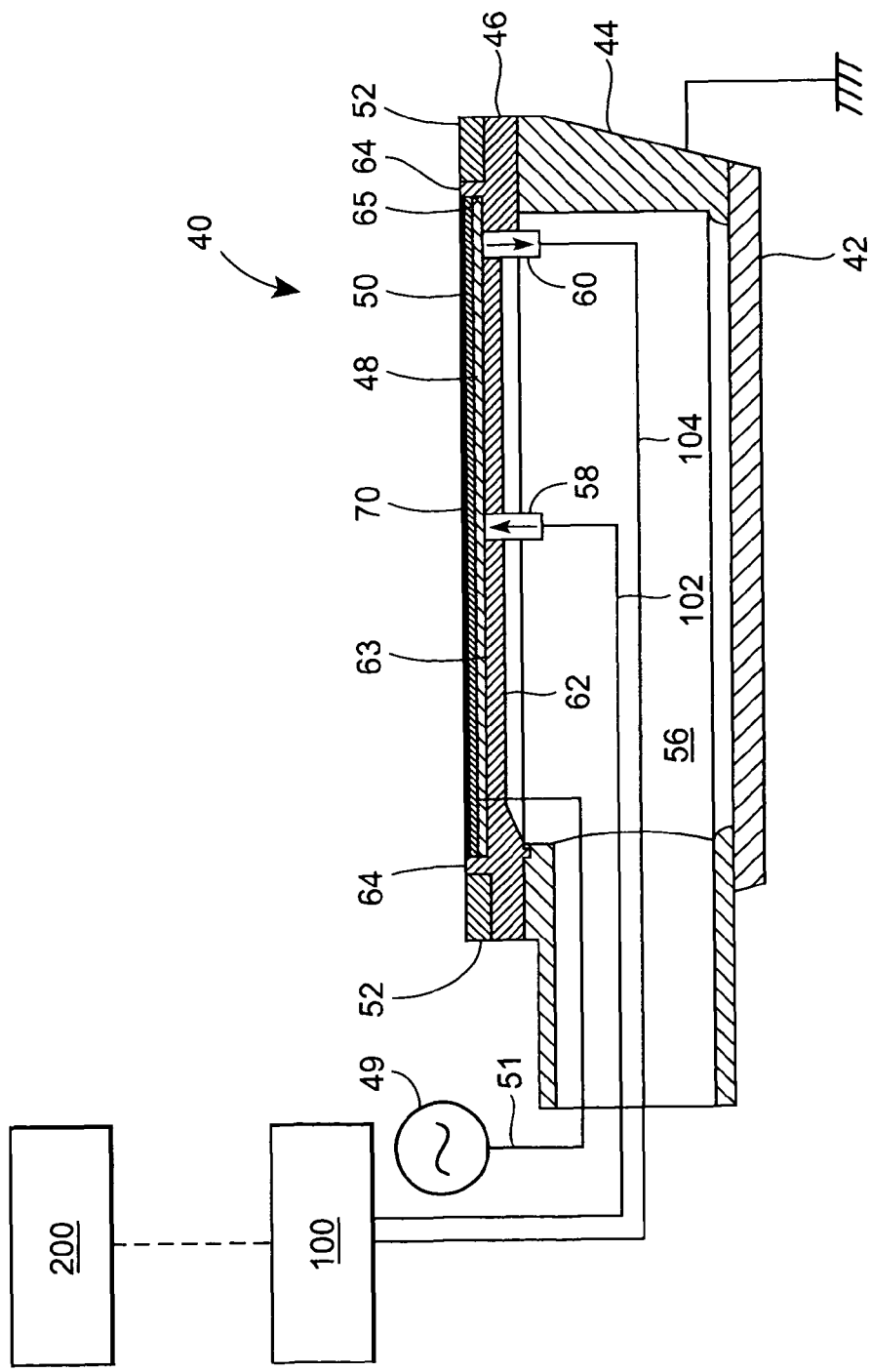
FIG. 2 is a cross-sectional view of a preferred embodiment of the substrate support.

FIG. 2 illustrates a preferred embodiment of the substrate support 40. The substrate support 40 can be used in the reaction chamber 10, for example. The substrate support 40 comprises a bottom cover 42, a base 44 on the cover 42, a ceramic member 46 overlying the base 44 and enclosing an interior space 56, a low-mass heat transfer member 48 overlying the ceramic member 46, and an electrostatic chuck 50 overlying the heat transfer member 48. An RF power source 49 is electrically connected to the heat transfer member 48 via an electrical conductor 51 to provide RF bias. An edge ring 52 overlies the ceramic member 46 and surrounds the heat transfer member 48, and the electrostatic chuck 50. The edge ring 52 can be made of quartz, SiC, or the like. A substrate 70 is shown supported on the electrostatic chuck 50.

The substrate support 40 includes an inlet 58 and an outlet 60 in fluid communication with one or more flow passages provided in the heat transfer member 48. The inlet 58 and outlet 60 are in fluid communication with a liquid source 100 via a supply line 102 and a return line 104, respectively. Liquid is circulated from the liquid source 100 via the supply line 102, into the flow passages of the heat transfer member 48 via the inlet 58, through the flow passages, and returned to the liquid source 100 via the outlet 60 and return line 104. The operation of the liquid source 100 is preferably controlled by a controller 200 in control communication with the liquid source 100.

The base 44 is made of a metal, such as aluminum, an aluminum alloy, or the like. The base 44 is electrically grounded.

In the embodiment shown in FIG. 2, the ceramic member 46 is secured to the base 44. For example, metal inserts or the like can be inserted in the ceramic member 46 for receiving mating fasteners, such as bolts, screws, or the like, to fasten the ceramic member 46 to the base 44. The ceramic member 46 is made of a suitable material, and also is configured, to have sufficient rigidity to counterbalance the pressure (typically atmospheric pressure) acting on the bottom surface 62 of the ceramic member 46. The ceramic member 46 preferably has a sufficiently high modulus (e.g., at least 15 Mpsi) to withstand deflection during plasma processing. By minimizing deflection of the ceramic member 46, the dimensional stability of the ceramic member 46, and of the overlying heat transfer member 48 and electrostatic chuck 50, is maintained during plasma processing. For example, the ceramic member 46 can have a thickness of from about 1-4 mm at its thinnest portion. During processing, the base 44 may be at either a higher or lower temperature than the heat transfer member 48. The ceramic member 46 preferably has a sufficiently low thermal conductivity to thermally isolate it from the base 44. In addition, the ceramic member 46 provides RF isolation from ground for the RF-driven heat transfer member 48. The ceramic member 46 can be made of alumina ($Al_2O_3$), or other suitable materials.

In a preferred embodiment, the top of the ceramic member 46 has a central recessed surface 63 surrounded by a peripheral flange 64. The recessed surface 63 can be formed by a machining process, such as milling, or the like, after the ceramic member 46 is made. Alternatively, the recessed surface 63 can be formed by the process used to form the ceramic member 46, e.g., by molding or casting. The heat transfer member 48 is disposed on the recessed surface 63, preferably flush With the flange 64.

The heat transfer member 48 is preferably adhesively bonded to the recessed surface 63 of the ceramic member 46. Adhesive applied between the ceramic member 46 and the heat transfer member 48 preferably has a low thermal conductivity to thermally isolate the heat transfer member 48 from the ceramic member 46. The adhesive preferably also has sufficient elasticity to accommodate thermal strain generated between the ceramic member 46 and the heat transfer member 48 during plasma processing of semiconductor substrates. The adhesive is preferably an elastomeric material, such as a room temperature-curing adhesive available from General Electric as RTV 133 and RTV 167.

Figure 3:
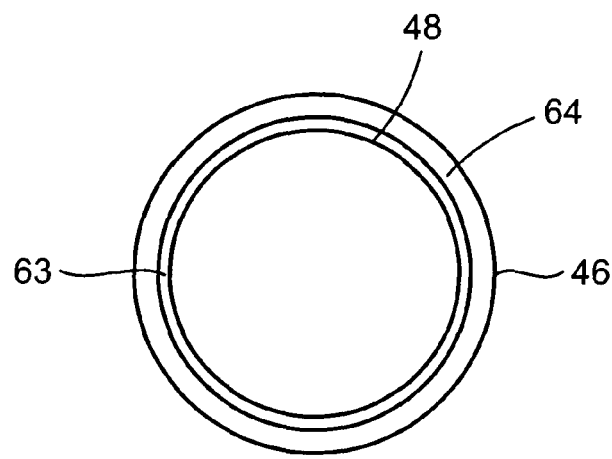
FIG. 3 is a top plan view depicting a low thermal mass heat transfer member overlying a ceramic member of the substrate support.

The heat transfer member 48 preferably has a smaller width than that of the recessed surface 63 so that the peripheral edge of the heat transfer member 48 is laterally spaced from the flange 64. For example, the recessed surface 63 can be circular, and the heat transfer member 48 can also be circular and have a smaller diameter than the recessed surface 63 (FIG. 3). The electrostatic chuck 50 is mounted on the flange 64 and the heat transfer member 48. For example, in the case of processing a 300 mm wafer, the electrostatic chuck 50 can have a diameter approximately equal to the diameter of the recessed surface 63 and the wafer, e.g., about 298 mm, so that the electrostatic chuck 50 contacts the flange 64. The heat transfer member 48 can have a diameter less than about 298 mm so that it is spaced from the flange 64.

Figure 4:
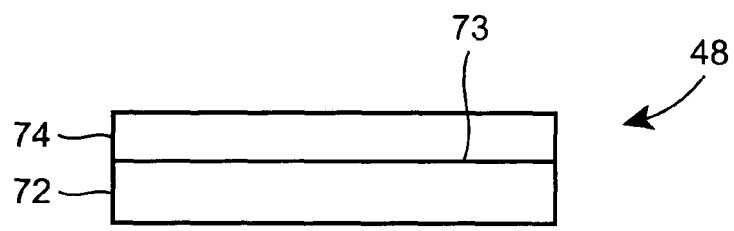
FIG. 4 depicts an embodiment of the heat transfer member with a two-piece construction.

As shown in FIG. 4, the heat transfer member 48 preferably includes a base 72 and an overlying cover 74. The heat transfer member 48 can be made of a metal having sufficient heat transfer properties, such as copper, a copper alloy, aluminum, an aluminum alloy, and the like. The base 72 and cover 74 are preferably joined together by brazing, or the like, to provide a fluid seal between them.

The base 72 preferably has a thickness of about ¼ inch or less, more preferably about ⅛ inch or less. The cover 74 preferably has a thickness of about 1/16 inch or less. The base 72 and cover 74 preferably have a maximum combined thickness of about ¼ inch, more preferably about ⅛ inch.

Figure 5:
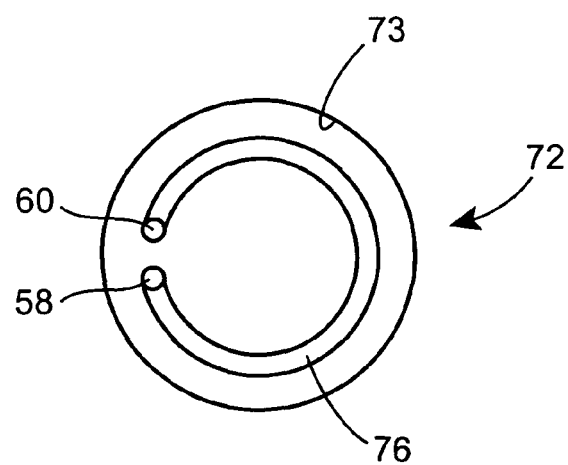
FIG. 5 is a top plan view of an embodiment of the base of the heat transfer member showing a flow passage.

The base 72 includes a top surface 73 in which one or more flow passages are formed. FIG. 5 shows a preferred embodiment of the base 72 including a circular flow passage 76. Liquid is introduced into the flow passage 76 via the inlet 58 and the supply line 102, and the liquid is returned to the liquid source 100 via the outlet 60 and the return line 104. The flow passages can have other arrangements in the base 72 to provide temperature control of the heat transfer member 48. For example, the flow passages can alternatively have a spiral, zig-zag, or other pattern.

The flow passages in the base 72 can have various cross-sectional shapes, including, for example, semi-circular, circular, rectangular, square, other polygonal shapes, and the like. The transverse cross-sectional area of the flow passages can be chosen to provide a desired volume of the flow passages based on the desired volumetric flow rate of the liquid through the flow passages, and the heat transfer capabilities of the liquid. In a preferred embodiment, the flow passages have a width of about 1/32 to about 3/32 inch, and a depth of about 1/32 to about 1/16 inch.

The flow passages in the base 72 can be formed by any suitable process. For example, the flow passages can be formed in the top surface 73 after the base 72 is formed, such as by a machining process. Alternatively, the flow passages can be formed during manufacturing of the body, such as by a casting, forging, stamping, or other process.

The liquid can be water (e.g., deionized water), ethylene glycol, silicon oil, water/ethylene glycol mixtures, and the like. The cooling performance of the liquid can be controlled by using different liquids and/or mixtures of different liquids, varying the liquid flow rate, and/or varying the temperature of the liquid introduced into the flow passages. The temperature of the liquid can preferably be adjusted by the liquid source 100.

Referring to FIG. 2, the electrostatic chuck 50 includes an electrically conductive electrode (or a pair of electrodes for bipolar operation) sandwiched in a dielectric material. The electrode is provided for clamping the substrate 70. RF bias is capacitively coupled through the electrostatic chuck 50 to the substrate 70. The heat transfer member 48 preferably has a flat upper surface to enhance the coupling uniformity. The dielectric material can be a suitable ceramic material, such as alumina, or the like. The conductive electrode can be made of tungsten, or the like. The electrostatic chuck 50 can have a thickness of about 1 mm, for example. The electrostatic chuck 50 has a width such that its peripheral edge contacts the flange 64 of the ceramic material 46. Accordingly, there is no direct RF path to the heat transfer member 48, which avoids arcing. The dielectric material forms an exposed surface of the electrostatic chuck for supporting the substrate 70. The exposed surface is preferably circular to match the shape of the substrate 70 in the form of a wafer.

Figure 6:
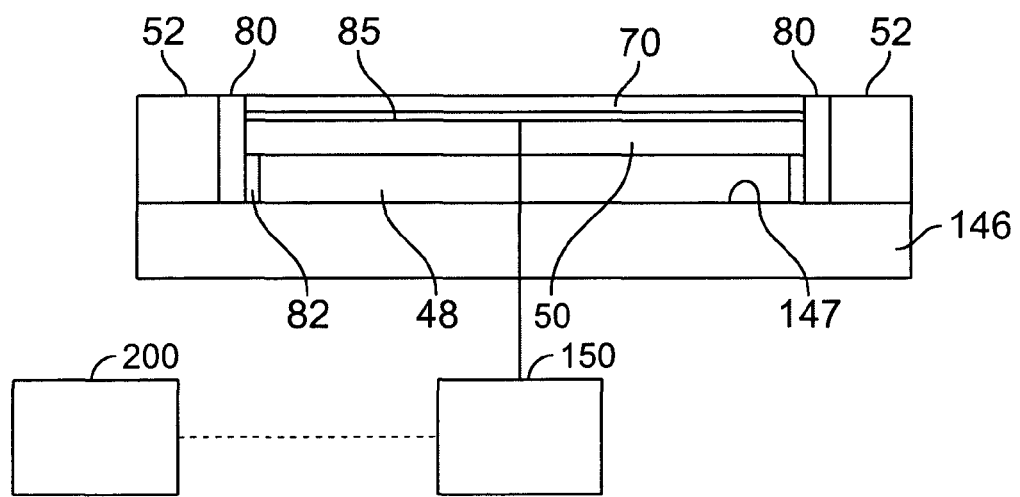
FIG. 6 depicts a portion of a substrate support according to another preferred embodiment.

In another preferred embodiment shown in FIG. 6, the ceramic member 146 has a planar surface 147 (i.e., a non-recessed surface) on which the heat transfer member 48 is disposed. The electrostatic chuck 50 overlies the heat transfer member 48. A wafer 70 is shown positioned on the electrostatic chuck 50. An inner ring 80 is disposed on the surface 147 and surrounds the heat transfer member 48, electrostatic chuck 50, and wafer 70. An edge ring 52 surrounds the inner ring 80. The inner ring 80 preferably is made of the same material as the ceramic member 146 (e.g., alumina). The heat transfer member 48 is laterally separated from the inner ring 80 by a space 82. The electrostatic chuck 50 contacts the inner ring 80.

The electrostatic chuck 50 is preferably bonded to the heat transfer member 48 with a suitable adhesive material, such as an elastomeric material. The adhesive preferably includes a material, such as a metallic filler, to enhance its thermal conductivity to provide sufficient heat transfer between the electrostatic chuck 50 and the underlying heat transfer member 48. For example, the adhesive can include particles of at least one metal or metal alloy to enhance its conductivity.

As explained above, a large metallic cold plate (typically made of aluminum) can have a thickness of 1¼ inch or more and a corresponding large thermal mass. In contrast, the heat transfer member 48 preferably has a volume equal to about 5-10% of the volume of such large cold plate. Due to the significantly reduced volume of the heat transfer member 48, the amount of heat that needs to be removed from, or added to, the heat transfer member 48 to change its temperature by a given amount, is significantly reduced as compared to such a large cold plate. The heat transfer member 48 preferably can be heated and/or cooled at a rate of from about 0.25° C./sec to about 2° C./sec. In comparison, a large cold plate, which has a large thermal mass, provides a temperature change rate that may only be as high as about 1° C./min or less. The heat transfer member 48 preferably can be controlled to a temperature ranging from about −20° C. to about 80° C. during plasma processing.

Furthermore, due to the low thermal mass of the heat transfer member 48, the volumetric flow rate of liquid that needs to be supplied to the heat transfer member 48 to heat and/or cool the heat transfer member 48 to a desired temperature is significantly reduced as compared to the liquid flow rate needed to heat and/or cool a large cold plate having a large thermal mass.

A preferred embodiment of the substrate support 40 includes a liquid source 100, a heat transfer gas source 150 (FIG. 6), and a controller 200. As described above, the liquid source 100 (FIG. 2) supplies liquid to the flow passages in the heat transfer member 48. The liquid source 100 can comprise a thermoelectric chiller (e.g., a Peltier cooler), heat exchanger, or the like, to supply liquid at a selected temperature and/or flow rate to the flow passages. The liquid source 100 can comprise a suitable pump arrangement. The chiller or the like is preferably located close to the heat transfer member 48 to reduce the distance that the liquid flows from the liquid source 100, thereby reducing the liquid volume in the liquid path that needs to be heated or cooled, as well as reducing the response time of the liquid source.

The heat transfer gas source supplies heat transfer gas to the heat transfer gas passages. Heat transfer gas is flowed through the heat transfer gas passages, to the exposed surface of the electrostatic chuck 50, where the heat transfer gas is distributed via openings and/or channels (not shown) formed in the exposed surface to the interface 85 between the exposed surface and the backside of the substrate 70 (FIG. 6). A suitable heat transfer gas supply system that provides zone cooling of the exposed surface of a substrate support is disclosed in commonly-assigned U.S. Pat. No. 5,609,720, which is incorporated herein by reference in its entirety. The heat transfer gas can be any gas having heat transfer capabilities to sufficiently transfer heat away from the substrate during plasma processing. For example, the heat transfer gas can be helium, or the like.

The controller 200 can preferably control operation of the liquid source to selectively vary parameters of the liquid supplied to the flow passages, and also control operation of the heat transfer gas source 150 to selectively vary parameters of the heat transfer gas supplied to the heat transfer gas passages. The controller 200 preferably can control operation of the liquid source 100 to control the temperature and/or flow rate of liquid supplied to the flow passages by the liquid source, and control operation of the heat transfer gas source 150 to control the flow rate and/or pressure of heat transfer gas supplied to the interface portion, to achieve a desired temperature at the exposed surface.

The controller 200 preferably receives input signals from one or more temperature sensors (not shown) positioned in the substrate support 40 to measure temperature at one or more selected locations of the substrate support 40 and/or on the substrate (e.g., at the backside). For example, temperature sensors can be disposed to measure temperature at locations proximate the exposed surface of the electrostatic chuck 50. The temperature sensors preferably provide real time temperature measurements to enable feedback control of the operation of the liquid source 100, as well as control of the operation of the heat transfer gas source 150. The controller 200 can be manually operable or programmed to automatically control operation of the liquid source 100 and the heat transfer gas sources 150.

The substrate support 40 can be used in a plasma processing apparatus in which various plasma processing operations including plasma etching, plasma enhanced chemical vapor deposition (PECVD) and/or resist removal are performed. The plasma processing operations can be performed for various substrate materials including semiconducting, dielectric and metallic materials.

The substrate support 40 can provide dynamic, close temperature control, which is useful for various vacuum semiconductor processes. For example, these characteristics are useful for accurate, step-changeable temperature control in gate and shallow trench isolation ("STI") etching processes. The substrate support 40 temperature can alternatively be ramped (e.g., linearly) to form tapering sidewalls in substrates during etching, for example. The capability to rapidly change the substrate temperature is useful in various processes, such as dielectric material etch processes, in which the high power densities that are utilized can cause rapid wafer over-temperature conditions to occur unless heat is rapidly removed from the substrate.

While the invention has been described in detail with reference to specific embodiments thereof, it will be apparent to those skilled in the art that various changes and modifications can be made, and equivalents employed, without departing from the scope of the appended claims.

What is claimed is:

1. A substrate support useful in a reaction chamber of a plasma processing apparatus, the substrate support comprising:
   a ceramic member;
      a metallic heat transfer member overlying the ceramic member, the heat transfer member having a maximum thickness of about ¼ inch, the heat transfer member including at least one flow passage through which a liquid can be circulated to heat and cool the heat transfer member;
      an electrostatic chuck overlying the heat transfer member, the electrostatic chuck having a support surface for supporting a substrate in a reaction chamber of a plasma processing apparatus;
      a source of temperature controlled liquid in flow communication with the at least one flow passage; and
      a controller operable to control the volumetric flow rate and/or the temperature of the liquid circulated through the at least one flow passage, so as to control heating and cooling of the heat transfer member at a rate of from about 0.25-2° C./sec, wherein heating is performed solely by the heat transfer member.

2. The substrate support of claim 1, wherein the heat transfer member has a maximum thickness of about ⅛ inch.

3. The substrate support of claim 1, wherein the at least one flow passage has a width of about 1/32 to about 3/32 inch, and a depth of about 1/32 to about 1/16 inch.

4. The substrate support of claim 1, wherein the source of temperature controlled liquid includes a Peltier cooler operable to change the temperature of the liquid to a selected temperature.

5. The substrate support of claim 1, further comprising:
   a heat transfer gas source operable to supply a heat transfer gas between the support surface and the substrate;
   wherein the controller is operable to control the flow rate and/or pressure of the heat transfer gas supplied between the support surface and the substrate.

6. The substrate support of claim 1, wherein the heat transfer member comprises a base including the at least one flow passage, and a cover overlying the base.

7. The substrate support of claim 1, wherein: the ceramic member includes a recessed surface and a peripheral flange, the ceramic member has a thickness of from about 1-4 mm at the recessed surface; the heat transfer member is disposed on the recessed surface and laterally spaced from the flange; and the electrostatic chuck contacts the flange.

8. The substrate support of claim 1, further comprising a ceramic ring overlying the ceramic member and surrounding the heat transfer member and the electrostatic chuck, the heat transfer member being laterally spaced from the ceramic ring, the electrostatic chuck contacting the ceramic ring.

9. The substrate support of claim 1, further comprising an RF power source electrically connected to the heat transfer member.

10. The substrate support of claim 1, further comprising an elastomeric joint between the ceramic member and the heat transfer member, and an elastomeric joint between the heat transfer member and the electrostatic chuck.

11. A plasma processing apparatus comprising the substrate support of claim 1.

12. A method of thermally controlling a substrate in a plasma processing apparatus, comprising: placing a substrate on the support surface of the substrate support according to claim 1 in a reaction chamber of a plasma processing apparatus; introducing a process gas into the reaction chamber; generating a plasma from the process gas in the reaction chamber; processing the substrate; and circulating a liquid through the at least one flow passage to control the temperature of the heat transfer member to a selected temperature during processing of the substrate.

13. The method of claim 12, further comprising: circulating a liquid having a first temperature through the at least one flow passage to control the temperature of the heat transfer member to a first temperature during processing of the substrate; and circulating a liquid having a second temperature through the at least one flow passage to control the temperature of the heat transfer member to a second temperature during processing of the substrate; wherein the temperature of the heat transfer member is (i) ramped from the first temperature to the second temperature, or (ii) changed step-wise from the first temperature to the second temperature.

14. The substrate support of claim 1, wherein the controller is operable to circulate a liquid having a first temperature through the at least one flow passage to control the temperature of the heat transfer member to a first temperature during processing of the substrate; circulating a liquid having a second temperature through the at least one flow passage to control the temperature of the heat transfer member to a second temperature during processing of the substrate; wherein the temperature of the heat transfer member is (i) ramped from the first temperature to the second temperature, or (ii) changed step-wise from the first temperature to the second temperature.

* * * * *